(12) United States Patent
Tsai et al.

(10) Patent No.: US 12,453,168 B2
(45) Date of Patent: Oct. 21, 2025

(54) SEMICONDUCTOR DEVICE WITH SHORT-RESISTANT CAPACITOR PLATE

(71) Applicant: TAIWAN SEMICONDUCTOR MANUFACTURING COMPANY, LTD., Hsinchu (TW)

(72) Inventors: Cheng-Hung Tsai, Hsinchu (TW); Xi-Zong Chen, Hsinchu (TW); Hsiao Chien Lin, Hsinchu (TW); Chia-Tsung Tso, Hsinchu (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 108 days.

(21) Appl. No.: 17/819,245

(22) Filed: Aug. 11, 2022

(65) Prior Publication Data

US 2022/0384426 A1    Dec. 1, 2022

Related U.S. Application Data

(62) Division of application No. 17/069,365, filed on Oct. 13, 2020, now Pat. No. 11,621,263.

(51) Int. Cl.
*H10D 84/80* (2025.01)
*H10D 1/68* (2025.01)
*H01L 21/3213* (2006.01)

(52) U.S. Cl.
CPC .......... *H10D 84/811* (2025.01); *H10D 1/692* (2025.01); *H01L 21/32134* (2013.01)

(58) Field of Classification Search
CPC ................ H01L 27/0629; H01L 28/60; H01L 21/32134
See application file for complete search history.

(56) References Cited

U.S. PATENT DOCUMENTS

| | | | | |
|---|---|---|---|---|
| 8,242,551 B2* | 8/2012 | Ching | ............ | H10B 12/09 438/398 |
| 8,552,485 B2* | 10/2013 | Chang | ............ | H01L 23/481 257/296 |
| 8,890,224 B2* | 11/2014 | Chang | ............ | H10D 84/212 257/296 |
| 8,895,385 B2* | 11/2014 | Chang | ............ | H01L 23/5223 257/E21.651 |
| 11,031,394 B1* | 6/2021 | Or-Bach | ............ | G06F 30/39 |
| 11,145,541 B2* | 10/2021 | Wallace | ............ | H01L 23/5226 |
| 11,152,305 B1* | 10/2021 | Hong | ............ | H10N 50/01 |

(Continued)

FOREIGN PATENT DOCUMENTS

| CN | 112490220 | | 3/2021 | |
|---|---|---|---|---|
| CN | 112490220 A | * | 3/2021 | ............ H10D 1/716 |

(Continued)

*Primary Examiner* — Laura M Menz
(74) *Attorney, Agent, or Firm* — Hauptman Ham, LLP

(57) ABSTRACT

A semiconductor device having source and drain regions in a semiconductor substrate, a transistor including a gate electrode over the semiconductor substrate, an isolation structure in the semiconductor substrate adjacent to the transistor, a first inter-dielectric layer (ILD) material over the isolation structure, and a capacitor film stack over the first ILD material that includes an isolation plate over and covering a capacitor plate, and a contact to the capacitor plate.

20 Claims, 10 Drawing Sheets

(56) References Cited

U.S. PATENT DOCUMENTS

| | | | | |
|---|---|---|---|---|
| 11,211,362 B2* | 12/2021 | Huang | ................. | H10D 84/212 |
| 11,227,830 B2* | 1/2022 | Lee | ................... | H01L 21/76825 |
| 11,329,140 B2* | 5/2022 | Huang | ................. | H10D 84/038 |
| 11,407,636 B2* | 8/2022 | Cheng | ................. | B81B 7/0006 |
| 11,410,923 B2* | 8/2022 | Tsai | ...................... | H01L 21/6835 |
| 11,410,995 B1* | 8/2022 | Song | .................. | H10D 64/117 |
| 11,411,011 B2* | 8/2022 | Wu | ....................... | G11C 11/221 |
| 11,621,263 B2* | 4/2023 | Tsai | ...................... | H10D 1/692 |
| | | | | 257/532 |
| 11,653,572 B2* | 5/2023 | Chuang | ................. | H10N 50/01 |
| | | | | 257/427 |
| 11,862,612 B2* | 1/2024 | Huang | ................ | H01L 25/0657 |
| 11,996,466 B2* | 5/2024 | Huang | ................ | H10D 64/015 |
| 12,057,392 B2* | 8/2024 | Lee | ...................... | H10D 1/474 |
| 12,080,547 B2* | 9/2024 | Liou | ..................... | H01L 21/02164 |
| 2002/0149049 A1* | 10/2002 | Okuda | ............. | H01L 21/32134 |
| | | | | 257/E21.309 |
| 2003/0173610 A1* | 9/2003 | Okuda | ............. | H01L 21/31116 |
| | | | | 257/E21.309 |
| 2010/0224925 A1* | 9/2010 | Ching | .................... | H10D 1/042 |
| | | | | 257/532 |
| 2012/0091519 A1* | 4/2012 | Tu | ....................... | H01L 23/5223 |
| | | | | 257/532 |
| 2012/0181657 A1* | 7/2012 | Wu | ..................... | H01L 21/7687 |
| | | | | 257/532 |
| 2012/0289021 A1* | 11/2012 | Ching | .................. | H10D 84/811 |
| | | | | 438/386 |
| 2012/0319239 A1* | 12/2012 | Chang | ................ | H01L 23/642 |
| | | | | 257/532 |
| 2013/0320493 A1* | 12/2013 | Chang | ................ | H01L 23/5283 |
| | | | | 257/532 |
| 2014/0015101 A1* | 1/2014 | Chang | ................. | H01L 23/642 |
| | | | | 257/532 |
| 2014/0017873 A1* | 1/2014 | Chang | ..................... | H10D 1/68 |
| | | | | 438/396 |
| 2016/0197138 A1* | 7/2016 | Chen | .................... | H10D 84/811 |
| | | | | 257/534 |
| 2017/0092692 A1* | 3/2017 | Kalnitsky | .............. | H10N 50/10 |
| 2019/0043870 A1* | 2/2019 | Lin | ................... | H01L 21/76802 |
| 2020/0105593 A1* | 4/2020 | Wu | ..................... | H10D 84/0158 |
| 2020/0135641 A1* | 4/2020 | Lee | .................... | H01L 23/5226 |
| 2020/0136027 A1* | 4/2020 | Wu | ....................... | H10N 50/85 |
| 2020/0176574 A1* | 6/2020 | Huang | ............. | H01L 21/76865 |
| 2020/0185271 A1* | 6/2020 | Wallace | ............ | H01L 21/76816 |
| 2021/0074805 A1* | 3/2021 | Lin | ..................... | H01L 23/5223 |
| 2021/0098248 A1* | 4/2021 | Wu | ....................... | H10B 61/00 |
| 2021/0134602 A1* | 5/2021 | Arshad | ............. | H01L 21/30625 |
| 2021/0328005 A1* | 10/2021 | Shen | .................. | H01L 23/5226 |
| 2022/0093684 A1* | 3/2022 | Chuang | ................. | H10N 50/01 |
| 2022/0115358 A1* | 4/2022 | Huang | ................. | H01L 23/481 |
| 2022/0115370 A1* | 4/2022 | Tsai | ..................... | H10D 84/811 |
| 2022/0384426 A1* | 12/2022 | Tsai | ..................... | H10D 1/692 |
| 2022/0406718 A1* | 12/2022 | Lin | ................... | H01L 23/5226 |
| 2023/0009266 A1* | 1/2023 | Chang | ................. | H10D 30/47 |
| 2023/0034701 A1* | 2/2023 | Lee | .................... | H10B 12/50 |
| 2023/0189511 A1* | 6/2023 | Lee | .................... | H10B 12/033 |
| | | | | 257/532 |
| 2023/0268355 A1* | 8/2023 | Chiu | .................. | H10D 88/01 |
| | | | | 257/288 |
| 2024/0088103 A1* | 3/2024 | Huang | ............. | H01L 21/76898 |
| 2024/0222364 A1* | 7/2024 | Hung | ................. | H10D 89/811 |
| 2024/0234487 A1* | 7/2024 | Huang | ................. | H10F 39/018 |

FOREIGN PATENT DOCUMENTS

| | | | | |
|---|---|---|---|---|
| CN | 113394221 | | 9/2021 | |
| CN | 113394221 A | * | 9/2021 | ............. H10D 30/67 |
| CN | 113809068 | | 12/2021 | |
| CN | 113809068 A | * | 12/2021 | ............. H10D 1/692 |
| CN | 117913086 A | * | 4/2024 | ............. H10D 84/85 |
| DE | 102023130236 A1 | * | 7/2024 | ........... H10D 89/931 |
| TW | 202215526 A | * | 4/2022 | ............. H10D 1/692 |

* cited by examiner

SEMICONDUCTOR DEVICE WITH SHORT-RESISTANT CAPACITOR PLATE

RELATED APPLICATIONS

This application is a divisional of U.S. patent application Ser. No. 17/093,131, filed Oct. 13, 2020, now U.S. Pat. No. 11,621,263, issued Apr. 4, 2023, the contents of which are incorporated herein in its entirety.

BACKGROUND

Robust integrated circuit manufacturing processes are able to reduce or avoid systemic defects in devices which result in immediate or long term failure due to effects such as electromigration and dopant diffusion. Maintaining robust manufacturing processes becomes more challenging as chip and circuit elements shrink over successive generations of integrated circuit design.

Device shrink and circuit element shrink over successive generations results in increased likelihood of manufacturing defects such as short circuits between conductive lines and other circuit elements.

DETAILED DESCRIPTION

Figure 1:
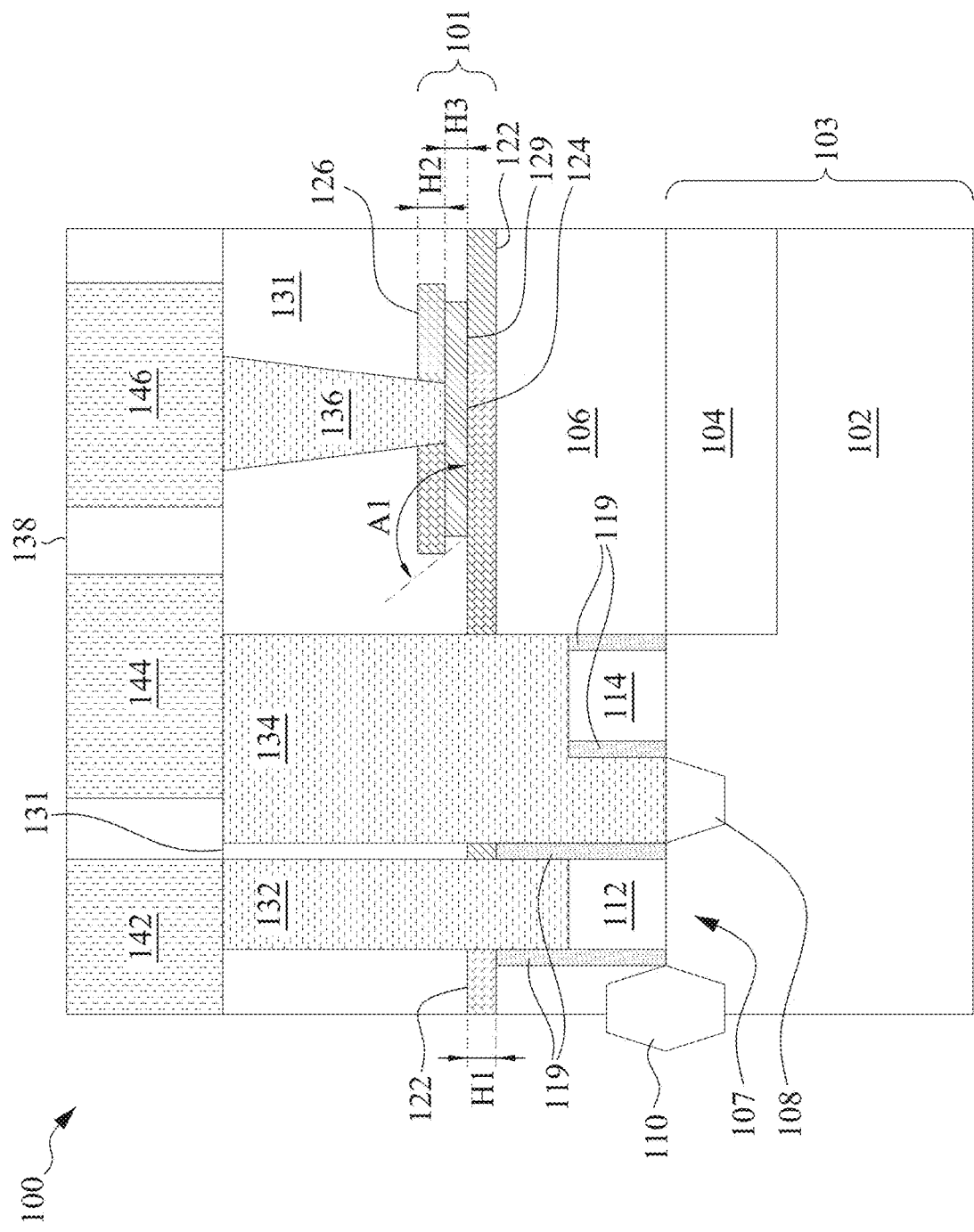
FIG. 1 is a cross-sectional view of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hardmask erosion during manufacture of semiconductor devices contributes to increased levels of device failures due to short circuits. Hardmasks provide protection for conductive materials below the hardmasks, both during film removal (e.g., etching the hardmask and a partially-protected conductive layer) and during metallization (e.g., filling of contacts and trenches with conductive materials). By changing a manufacturing process to reduce the amount of hardmask erosion which occurs, coverage of an underlying portion of conductive material increases, reducing short circuits to the underlying portion of conductive material from other metallized parts of the semiconductor device.

Decoupling capacitors, such as decoupling capacitor 101 in FIG. 1, described below, are, however, subject to manufacturing process variations which potentially result in short circuits. In particular, some decoupling capacitors short to conductive lines of the first metal line layer over integrated circuits (e.g., M0 or M1 lines). A short circuit between a decoupling capacitor plate and a conductive line (see, e.g., FIG. 1 conductive material 124 and conductive line 144) causes the integrated circuit to fail or become less reliable. Thus, improving robustness of a manufacturing process to reduce the frequency of shorts between decoupling capacitor plates and conductive lines increases overall yield and performance characteristics of an integrated circuit from a semiconductor device formed by the manufacturing process.

FIG. 1 is a cross-sectional view of a semiconductor device 100, in accordance with some embodiments. Semiconductor device 100 includes a decoupling capacitor 101. A decoupling capacitor 101 serves to regulate current flow through a semiconductor device to help prevent defects, e.g., dielectric breakdown, which increase the risk of short circuits of the semiconductor device.

Decoupling capacitor 101 is over a substrate 103 and a first inter-layer dielectric (ILD) material 106. Substrate 103 includes an isolation structure 104 and an active area 102. In some embodiments, isolation structure 104 is a shallow trench isolation (STI) structure. In some embodiments, isolation structure 104 is a deep trench isolation (DTI) structure. In some embodiments, isolation structure 104 is a LOCOS (local oxidation of silicon) structure.

In some embodiments, active area 102 is a portion of substrate 103 into which dopants have been added to form source and drain wells of a transistor. In some embodiments, source and drain regions are epitaxial regions which are grown or deposited in recesses in a doped well of a substrate, and are separated by a channel. In some embodiments, the substrate is an N-well in a P-doped substrate. In some embodiments, the substrate is a P-doped well in an N-well. Channel region 107 is in active area 102 of substrate 103 between EPI structure 108 and EPI structure 110.

Semiconductor device 100 includes EPI (epitaxially-grown) structures 108 and 110, which extend into active area 102. EPI structures 108 and 110 are epitaxially grown because the current through the transistor flows with less resistance through epitaxially-grown semiconductor material, in comparison to semiconductor material deposited by a chemical vapor deposition (CVD) process. In FIG. 1, EPI structure 110 extends above active area 102 because there is no contact above EPI structure. EPI structure 108 is about flush with active area 102 because a contact 134 has been formed against EPI structure 108. Channel region 107 is between EPI structure 108 and EPI structure 110. EPI structures 108 and 110 are source or drain structures for the semiconductor device 100. EPI structure 108 is recessed down to substrate 103 at the location of the cross-sectional view of semiconductor device 100 by the process of forming contact 134, as described below. EPI structure 110 is not recessed down to the substrate 103 at the location of the cross-sectional view of semiconductor device 100 because the contact to EPI structure 110 is outside the plane of the cross-sectional view. An EPI structure includes epitaxially grown semiconductor materials which induce strain in a channel of a semiconductor device in order to regulate the switching speed of a transistor.

Semiconductor device 100 includes a gate stack 112 and a gate stack 114. Gate stack 112 is between EPI structure 108 and EPI structure 110. Gate stack 114 is between EPI structure 108 and a first ILD material 106. In the present disclosure, a gate stack includes a gate dielectric (not shown) against spacers 119 and the active area 102, and a semiconductor material within the gate dielectric and exposed at a top side for electrical connection to a contact from a higher layer of the semiconductor device. Spacers 119 are against sidewalls of gate stack 112 and gate stack 114. Spacer 119 isolates gate stack 112 and a contact 132 from a contact 134 and gate stack 114. First ILD material 106 separates active area 102 and isolation structure 104 from first etch stop layer (ESL) 122.

According to some embodiments, the gate dielectric is a high-k gate dielectric with a dielectric constant greater than the dielectric constant of silicon dioxide. In some embodiments, the active area comprises a source region, a drain region, and one or more channel regions arranged in a gate-all-around (GAA) configuration, and the gate dielectric extends around the one or more channel regions of the active area. In some embodiments, a gate electrode, or metal gate, includes a conductive material (e.g., a semiconductor or a metal) deposited against the gate dielectric. In some embodiments, the gate electrode comprises tungsten, cobalt, ruthenium, and other metals compatible with gate electrodes for a GAA active area, or alloys thereof. In some embodiments, the metals are deposited by sputtering, and gaps between the one or more channel regions are filled by annealing the metal to promote diffusion of metal atoms. In some embodiments, the active area also includes workfunction adjustment layers which adjust the switching characteristics of the active areas to promote circuit matching or reduced power consumption.

In some embodiments, the active areas include source regions, drain regions, and channel regions with gate electrodes thereover and arranged in a fin-field effect transistor (FinFET) configuration. In some embodiments, the active areas are part of planar transistors with source regions, drain regions, and channel regions embedded in a bulk substrate which has been doped with dopant atoms to create the source or drain regions on opposite sides of the channel regions.

First ESL 122 is over a top surface of first ILD material 106. Conductive material 124 is over a top surface of first ESL 122. A second ESL 126 is over conductive material 124. First ESL 122 has openings therethrough for contacts 132 and 134. Conductive material 124 and second ESL 126 are layers deposited over first ESL 122. Contact 136 extends through a second ILD material 131 and second ESL 126 to electrically connect a conductive line 146 to conductive material 124 (e.g., the decoupling capacitor plate). A third ILD material 138 is over the top surface of second ILD material 131, and conductive lines 142, 144, and 146 extend along the top surface of second ILD material 131 and entirely through third ILD material 138. Second ILD material 131 and second ESL 126 protect conductive material 124 from an electrical connection to either contact 134 or conductive line 144.

Regarding the decoupling capacitor 101, first ESL 122 has a first thickness H1, second ESL 126 has a second thickness H2, and conductive material 124 has a third thickness H3. First thickness H1 ranges from about 7 nanometers (nm) to about 10 nm. For some embodiments having first thickness H1 below about 7 nm, there is an increase in voids formed during the filling of contacts to the source/drain structures of the semiconductor device and/or uneven coverage of the first ILD material 106. First some embodiments having first thickness H1 greater than about 10 nm, there is increased manufacturing time and manufacturing cost, with only a minor increase in device reliability or a minor decrease in void formation in the semiconductor device. Second thickness H2 ranges from about 2 nm to about 6 nm. In some embodiments having second thickness H2 less than about 2 nm, there is increased likelihood of incomplete and/or uneven coverage of the conductive material, and/or an elevated likelihood of pitting the conductive material during the etch process to form the capacitor plate. In some embodiments having H2 greater than about 6 nm, there is increased manufacturing time and manufacturing cost with little additional protection of the conductive material during the process of forming the capacitor plate. Third thickness H3 ranges from about 4 nm to about 12 nm. For some embodiments with third thickness H3 smaller than about 4 nm there is an increased likelihood of incomplete coverage and uneven thickness of the conductive material. For some embodiments with third thickness H3 greater than about 12 nm, there is an associated increase in manufacturing cost and manufacturing time. By increasing the conductive material (e.g., the capacitor plate) thickness beyond about 12 nm, there is little change in the capacitance or performance of the decoupling capacitor.

Second ILD material 131 covers the top surface and sides of second ESL 126, the sides of conductive material 124, and the top surface of first ESL 122. Contacts 132, 134, and 136 extend through an entirety of second ILD material 131. An angle A1 is the angle made by a reference line extending from the base of the conductive material 124 and the bottom edge or bottom corner of the second ESL 126 over the conductive material 124. For embodiments having angle A1 less than about 75° there is a significantly increased likelihood of short circuits between the conductive material and a metal line over the conductive material in the semiconductor device. For embodiments having an edge angle A1 greater than about 85° there is a significant decrease in the rate of short circuit formation in comparison to embodiments with an angle A1 of less than about 75°.

Conductive material 124 in semiconductor device 100 is a capacitor plate 129 for, e.g., a decoupling capacitor in the semiconductor device. In some embodiments, the substrate 103 located below isolation structure 104 acts as the second plate of the capacitor. In some embodiments, the conductive material 124 over an isolation structure 104 and first ILD material 106 is a first capacitor plate 129, and is coupled to a second capacitor plate (not shown) at a same vertical position in the semiconductor device, and over an adjacent isolation structure (not shown) and the first ILD material 106.

Figure 2:
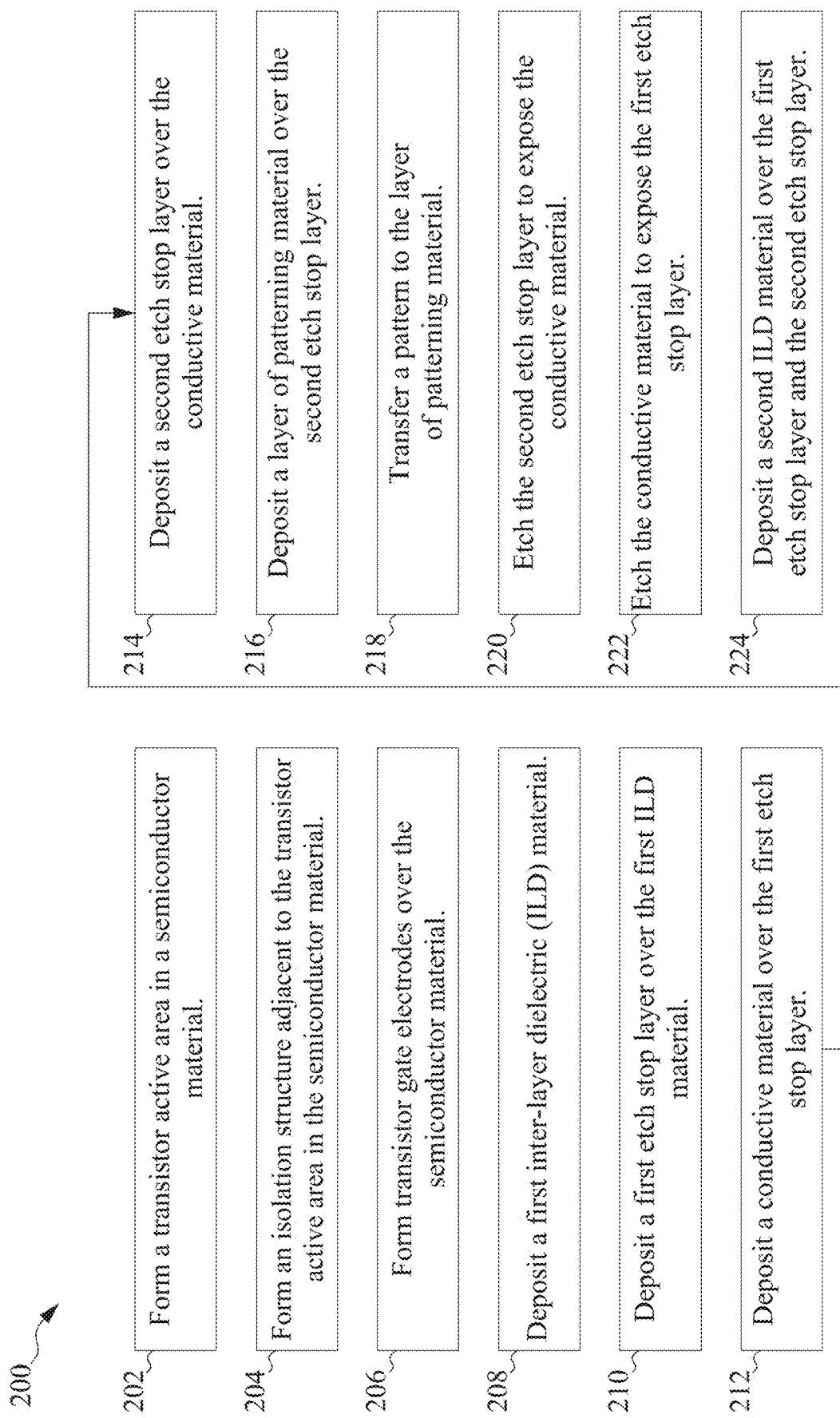
FIG. 2 is a flow diagram of a method of making a semiconductor device, in accordance with some embodiments.

FIG. 2 is a flow diagram of a method 200 of making a semiconductor device, in accordance with some embodiments. FIGS. 3A-3F are cross-sectional views of a semiconductor device 300 during various stages of a manufacturing process similar to method 200, in accordance with some embodiments. A person of ordinary skill will understand that the embodiments of the method 200 and the semiconductor device 300 described below are representative of, but not limiting, the scope of the present disclosure. There are other methods and semiconductor devices which also fall within the scope of the subject matter of the present disclosure. Operations of the method 200 relate to the manufacture of embodiments of semiconductor device 300, as follows: operations 202-214 relate to FIG. 3A; operations 216-218 relate to FIG. 3B; operation 220 relates to FIG. 3C; operation 222 relates to FIG. 3D and FIG. 3E; and operation 224 relates to FIG. 3F. Elements of semiconductor device 300 which have a same structure and function as elements of semiconductor device 100 (see FIG. 1), and are identified by a same identifying numeral, incremented by 200.

Figure 3A:
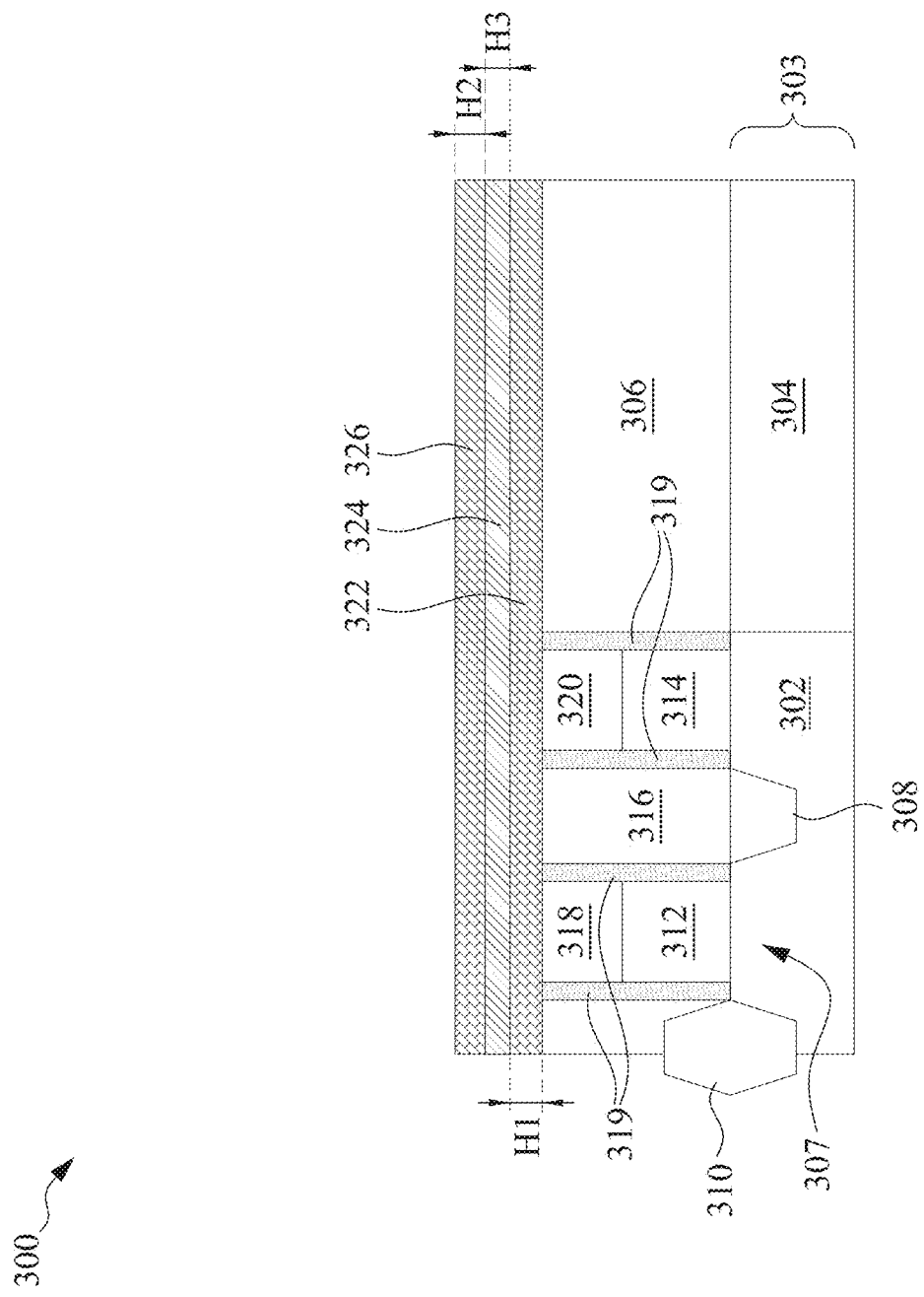
FIGS. 3A-3F are cross-sectional views of a semiconductor device during various stages of a manufacturing process, in accordance with some embodiments.

Method 200 includes an operation 202, wherein a transistor active area (active area) is formed in a semiconductor material of the semiconductor device. For example, active area 302 in FIG. 3A is an active area in a semiconductor material with source and drain regions (see EPI structures 308 and 310) therein. In some embodiments, forming a transistor active area in a semiconductor device includes a process of masking the region between the source and drain structures and performing an implant process into the semiconductor material. In some embodiments, forming the transistor active area further includes forming EPI structures in the semiconductor material in order to apply strain on the semiconductor material in the channel region of the active area.

FIG. 3A is a cross-sectional view of semiconductor device 300 during a manufacturing process similar to method 200. In FIG. 3A, active area 302 includes a channel region 307 and EPI structure 308 and EPI structure 310. EPI structures 308 and 310 are configured to be source/drain regions for the active area 302. In some embodiments, the substrate 303 is an intrinsic semiconductor material. In some embodiments, the substrate is a type IV semiconductor. In some embodiments, the substrate is a III-V semiconductor. In some embodiments, the substrate is a doped silicon substrate. In some embodiments, the substrate is a gallium arsenide or silicon germanium substrate.

According to some embodiments, the EPI structures 308 and 310 are formed by etching a recess into the substrate 303 in the active area 302 and performing an epitaxial growth process in the recess (e.g., between portions of a mask which protects a remainder of the substrate 303 outside the recesses) to form the EPI structures 308 and 310. In some embodiments, the EPI structures 308 and 310 are doped silicon. In some embodiments, the EPI structures are a different semiconductor material than the substrate. In some embodiments, the semiconductor material for EPI structures includes silicon carbide (SiC). In some embodiments, the semiconductor material for EPI structures includes silicon germanium (SiGe). In some embodiments, the EPI structures 308 and 310 induce strain in the substrate to regulate the switching speed of the transistor. In some embodiments, the EPI structures are doped in order to induce strain.

Method 200 includes an operation 204 wherein an isolation structure formed adjacent to the active area. In some embodiments, the isolation structure is formed immediately adjacent to a source or drain region in the active area. In some embodiments, the isolation structure is adjacent to an undoped portion of the active area. In some embodiments, the isolation structure is a shallow trench isolation (STI) structure. In some embodiments, the isolation structure is a deep trench isolation (DTI) structure. In some embodiments, the isolation structure is formed by performing an etch process to remove some of the substrate followed by a deposition process to fill the opening with a dielectric material. In some embodiments, the isolation structure is formed by masking portions of the substrate, including the active area, and performing an oxidation process of unmasked portions of the substrate to form dielectric material. In some embodiments, the oxidation process is a LOCOS process. In some embodiments, the oxidation process is a surface oxidation process.

In FIG. 3A, isolation structure 304 is adjacent to active area 302 in substrate 303. In some embodiments, the top surface of the isolation structure is approximately coplanar with the top surface of the active area. In some embodiments, the top surface of the isolation structure is above the top surface of the active area.

Method 200 includes an operation 206, wherein gate stacks are formed over the active area of the semiconductor device. As described above, gate stacks include the layer of gate dielectric material deposited against the top surface of the active area (see active area 302). In some embodiments, forming a gate dielectric includes depositing a high-dielectric constant dielectric material over the transistor active area (where the dielectric constant is larger than the dielectric constant of silicon dioxide). In some embodiments, forming a gate dielectric includes performing a surface oxidization of the active area (or, of the semiconductor material in the active area) to electrically isolate the channel from the transistor gate stack.

In some embodiments, forming a gate stack includes depositing a layer of gate electrode material and a layer of hard mask material over the layer of gate electrode material. In some embodiments, forming a gate stack includes depositing layers of patterning material over the layer of gate electrode material (or, when present, over the layer of hard mask material), developing or transferring the pattern to the layer of patterning material, and etching through openings the layer of patterning material to expose the active area. In some embodiments, forming gate electrodes includes forming spacers on the sides of the gate stacks (e.g., the sides of the gate electrode material and the gate dielectric material).

Method 200 includes an operation 208 wherein a first inter-layer dielectric (ILD) material is deposited over the substrate, the active area, the isolation structure, the gate electrodes. In some embodiments, the first inter-layer dielectric material is a spin-on glass material. In some embodiments, the first inter-layer of dielectric material is a dielectric material deposited by chemical vapor deposition (CVD), such as silicon dioxide. In some embodiments, operation 208 includes steps related to planarizing the first inter-layer dielectric material to expose the top edges of the gate stack.

In FIG. 3A, semiconductor device 300 includes an isolation structure 304 adjacent to an active area 302 in substrate 303. Substrate 303 includes EPI structure 308 and EPI structure 310 embedded therein. EPI structure 308 is between gate electrode 314 and gate stack 312, channel region 307 is between the EPI structure 308 and EPI structure 310, and below gate stack 312. Dummy contact 316 is made of dielectric material and is deposited in order to stabilize the gate stacks 312 and 314 during manufacturing. In some embodiments, dummy contact 316 is the same dielectric material as the first ILD material 306. In some embodiments, dummy contact 316 is a different dielectric material from the first ILD material 306. Spacers 319 are against the sides of the gate stacks 312 and 314.

Method 200 includes operation 210, wherein the first stop layer (ESL) is deposited over the first ILD material. The performance of operations 210, 212, and 214 comprises depositing a capacitor film stack for the decoupling capacitor described above in FIG. 1. In some embodiments, first etch stop layer is a layer of dielectric material different from the dielectric material of the first inter-dielectric deposited over the gate electrodes. In some embodiments, the first etch stop layer is a layer of silicon nitride or silicon oxide-nitride. In some embodiments, the first etch stop layer is a layer of tantalum nitride (TaN). The first etch stop layer is an insulating layer between a conductive plate or capacitor plate of a decoupling capacitor in a semiconductor device. According to some embodiments, the first etch stop layer has a first thickness ranging from not less than 7 nanometers (nm) to not more than 10 nm. In some embodiments, first etch stop layer has a first thickness not greater than 9 nm. For embodiments having first thickness H1 below about 7 nm, there is an increase in voids formed during the filling of contacts to the source/drain structures of the semiconductor device and/or uneven coverage of the first ILD material 106. For embodiments having first thickness H1 greater than about 10 nm, there is increased manufacturing time and manufacturing cost, with only a minor increase in device reliability or a minor decrease in void formation in the semiconductor device. According to some embodiments, having a thick first etch stop layer (e.g., between 7 nm and 10 nm) provides for improved electrical isolation of the decoupling capacitor plate as compared to a first etch stop layer with a thickness of less than 7 nm.

In FIG. 3A, first etch stop layer 322 is deposited over the top surface of first ILD material 306 and over the top of the hard mask 318 and hard mask 320 over the gate electrodes.

Method 200 includes an operation 212 wherein a conductive material (e.g., a capacitor plate material) is deposited over the first etch stop layer. In some embodiments, conductive material includes a metal nitride material or a pure metal alloy consistent with the etch rate ratios for etch selectivity described below in FIG. 4 and FIG. 5. In some embodiments, the conductive material is deposited by sputtering a metal or a metal alloy from a target onto a top surface of the first etch stop layer. For example, in some embodiments the conductive material is titanium nitride. Titanium nitride is used in some embodiments because, for some etching solutions, the etch rate of titanium nitride is significantly larger than the etch rate of either the first etch stop layer below the titanium nitride layer, or the etch rate of the second etch stop layer deposited on top of the titanium nitride layer. For embodiments where the titanium nitride has a higher etch rate than the etch stop layers, the titanium nitride layer recesses, producing edge angles A1 ($\theta$)≥90°. The conductive material has a conductive material thickness (thickness H3) of at least 4 nm and not more than 12 nm. Third thickness H3 ranges from about 4 nm to about 12 nm. For embodiments with third thickness H3 smaller than about 4 nm, there is an increased likelihood of incomplete coverage and uneven thickness of the conductive material. For embodiments with third thickness H3 greater than about 12 nm, there is an associated increase in manufacturing cost and manufacturing time. According to some embodiments, the thickness H3 is comparable to the thickness of the first etch stop layer below the conductive material. A thickness H3 of less than about 4 nm is more likely to result in uneven film thickness, or uneven film coverage, which degrades the ability of the decoupling capacitor to respond to current or voltage fluctuations. A thickness H3 greater than about 12 nm increases material usage and cost of the manufacturing process without providing additional responsiveness to current or voltage fluctuations.

Method 200 includes an operation 214 wherein a second etch stop layer (e.g., an isolation material) is deposited over the conductive material. In some embodiments, the second etch stop layer is deposited by sputtering a metal or a metal alloy onto a top surface of the conductive material deposited in operation 212. According to some embodiments, the second etch stop layer is a same dielectric material as the first etch stop layer. In some embodiments, the second etch stop layer is a layer of tantalum nitride or another metal nitride with a lower etch rate than the etch rate of TiN, as described below. According to some embodiments, the second etch stop layer is a different dielectric material than the first etch stop layer. According to some embodiments, the second etch stop layer is deposited with a different thickness (thickness H2) than the thickness first etch stop layer (thickness H1). In some embodiments, thickness H2 is smaller than thickness H1.

In FIG. 3A, the second etch stop layer 326 is deposited over the top surface of the conductive material 324. In some embodiments, the second etch stop layer 326 has a thickness H2 ranging from about 4 nm to about 6 nm. A thickness H2 smaller than about 4 nm is associated with coverage of the conductive metal layer, increasing the risk of the etching plasma penetrating through the second etch stop layer to react with the conductive material during performance of operation 222. A thickness H2 larger than about 6 nm is not associated with increased performance benefit for a decoupling capacitor, while increasing the manufacturing costs of the semiconductor device.

Method 200 includes an operation 216 wherein a layer of patterning material is deposited over the top of the second etch stop layer. According to some embodiments, the patterning material deposited over the top second layer is a photoresist layer or a layer of material compatible with other types of pattern transfer such as ultraviolet lithography or electron beam lithography. In some embodiments, the layer of patterning material is deposited by spin deposition (e.g., as with photolithography or UV lithography). In some embodiments, additional layers of material are deposited over the top surface of the second etch stop layer in order to improve the accuracy of pattern transfer. Some examples of additional layers of material includes layers of antireflective coatings (ARC-layers) or layers of material used for double patterning-types of lithography.

Method 200 includes an operation 218 wherein a pattern is transferred to the layer of patterning material. In some embodiments, transferring the pattern is accomplished by performing a photolithographic, electron-beam, or ultraviolet-type lithography process although other types of pattern transfer described herein.

Figure 3B:
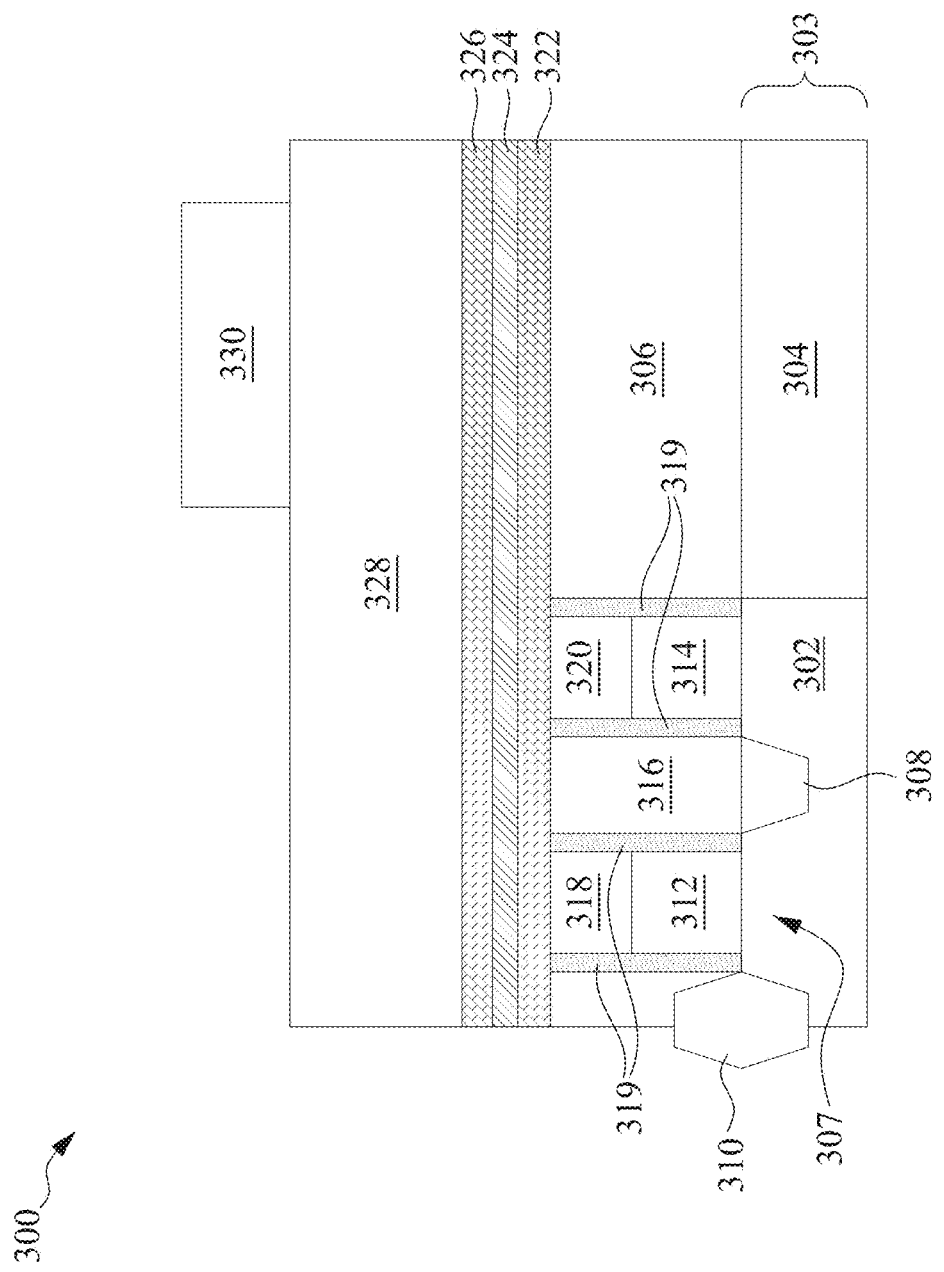

In FIG. 3B, anti-reflective coating (ARC) layer 328 is deposited over the top surface of the second etch stop layer 326. Patterning material 330 has been deposited over the top surface of ARC layer 328, and a pattern has been transferred to patterning material 330 as described above in operation 218. According to some embodiments, patterning material 330 a layer of photoresist compatible with single- or double-patterning lithographic processes, or UV lithography.

Method 200 includes an operation 220, wherein the second etch stop layer is etched to expose portions of the top surface of the conductive material. In some embodiments, etching the second etch stop layer involves forming an isolation plate from the material of the second etch stop layer (e.g., the isolation material, see operation 214, above). The second etch stop layer is etched by, e.g., a plasma etch process containing fluorine and argon to form volatile metal flourides which are easily removed during the etch process.

In some embodiments, the plasma etch process is highly anisotropic to preserve a dimension of the patterning material during the etch process. Preserving a dimension of the patterning material allows for more precise dimension control when making the capacitor plate below the second etch stop layer after the plasma etch process. More precise dimension control when making the capacitor plate allows for better semiconductor device matching across a wafer surface or in different parts of an integrated circuit.

Figure 3C:
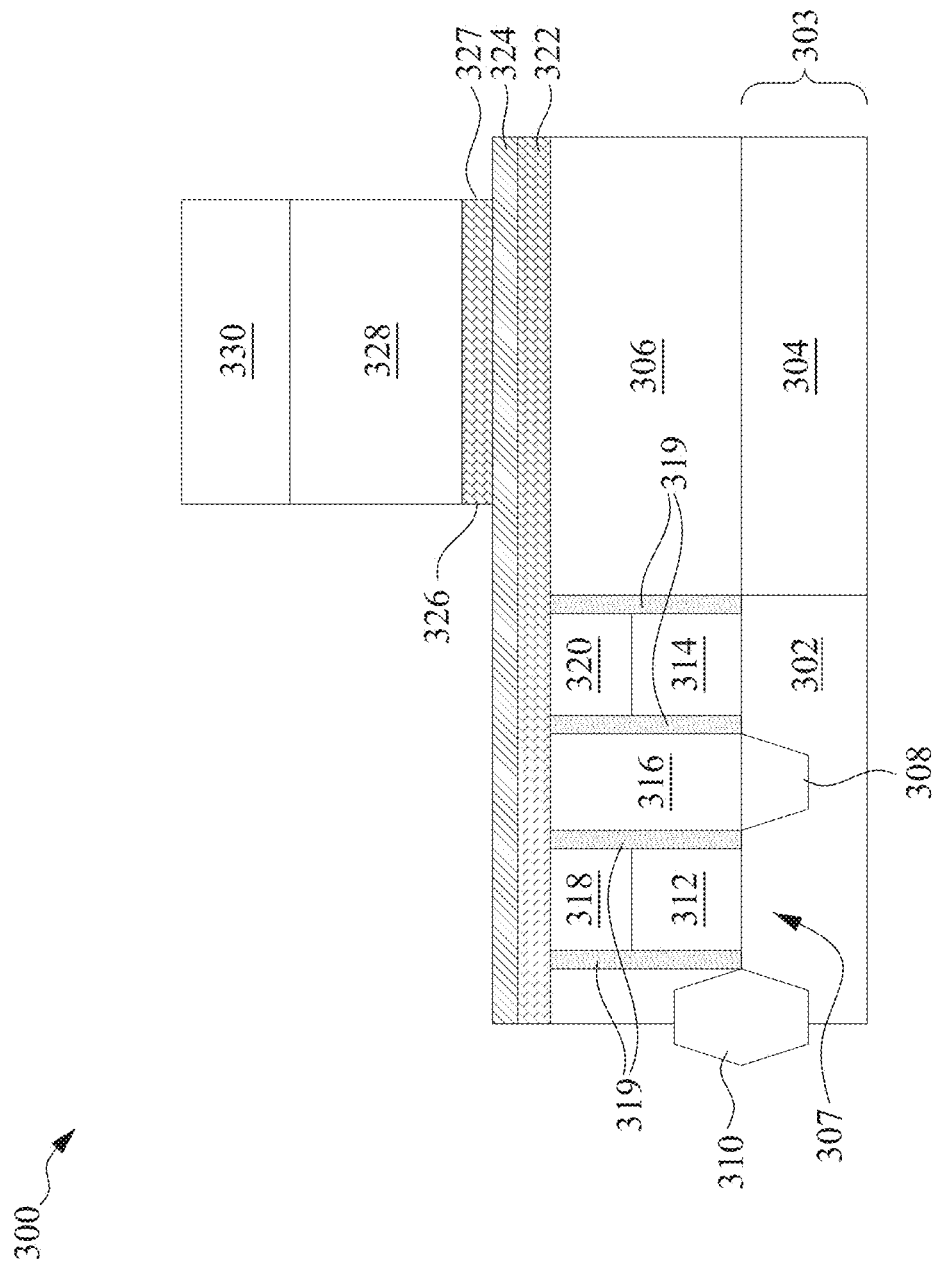

In FIG. 3C, ARC layer 328 has been etched to have a shape matching the shape in the layer of patterning material 330, and second etch stop layer 326 has been etched to expose portions of the top surface of conductive material 324. In FIG. 3C, the second etch stop layer has been etched to form a first isolating portion 327 of a decoupling capacitor. First isolating portion 327 has the unmodified thickness of the second etch stop layer as described above, and a width W1 (see FIG. 3E, below). During performance of method 200, width W1 of the first isolating portion 327 of the decoupling capacitor remains largely unchanged because the chemistry of the etching solution used to clear the conductive material exposed by performing operation 220 is selective for the conductive material, rather than the materials of the first isolating portion 327 or the first etch stop layer 322.

In some embodiments of operation 220, a plasma etch process is performed in order to remove portions of ARC layer 328 not masked by the patterning material 330, and portions of the second etch stop layer exposed after removing the unmasked portions of the ARC layer 328. A plasma etch process is effective at removing portions of the second etch stop layer without damaging the conductive material below. A wet etch process is employed to clear the conductive material and form the decoupling capacitor plate.

In some embodiments of operation 220 the patterning material 330 remains on top of the ARC layer 328. In some embodiments of the operation 220 the patterning material 330 is removed during the process etching the ARC layer 328 to expose the top surface of the second etch stop layer, or is removed during the process of etching the second etch stop layer to expose the layer of conductive material. A plasma etch process which is used to clear the second etch stop layer and expose layer of conductive material (see conductive material 324) is an anisotropic etch process configured to maintain a dimension of the patterning material 330 as closely as possible while forming the first isolating portion 327 from the second etch stop layer 326.

Figure 3D:
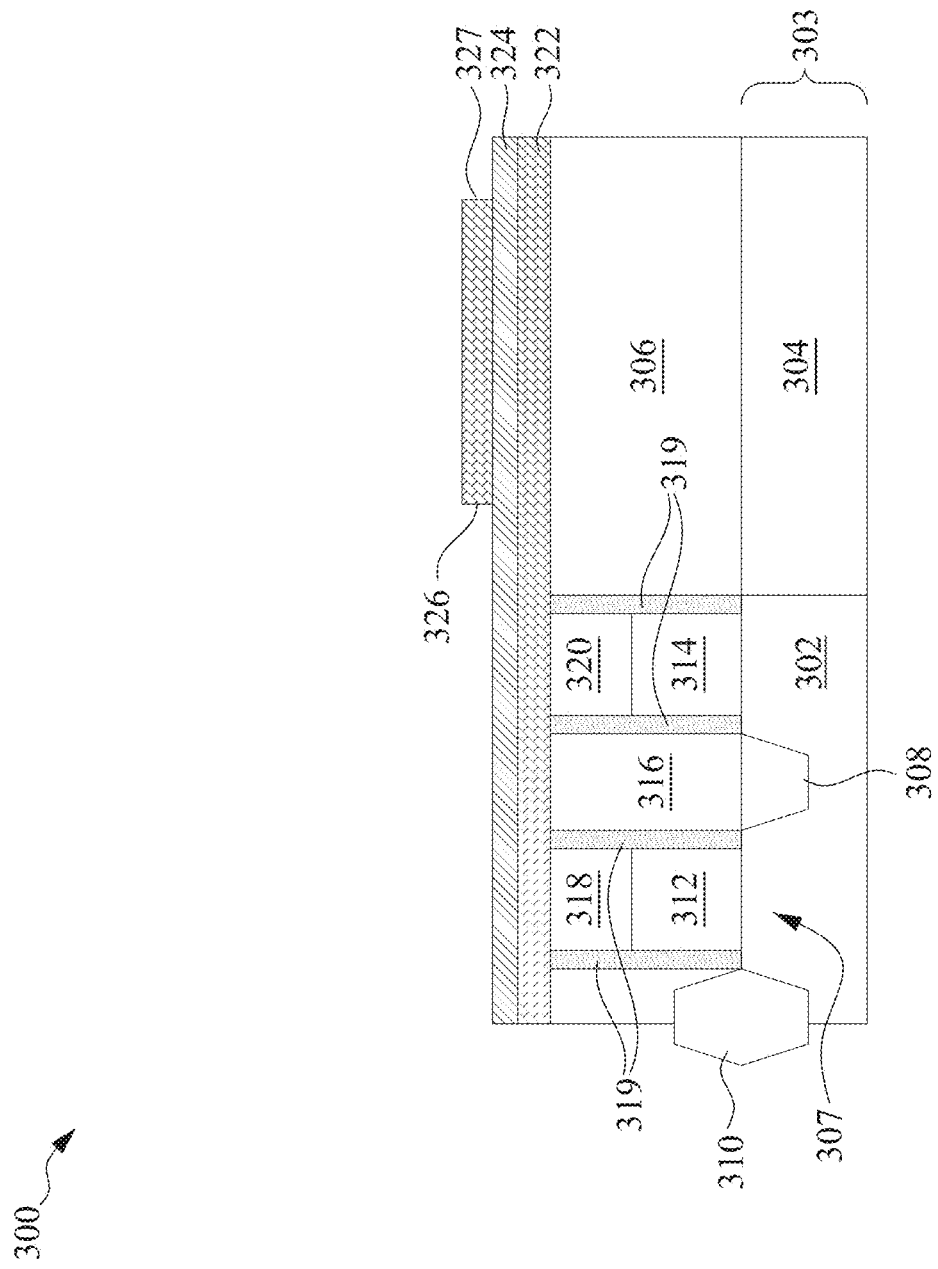

In some embodiments of operation 220, the patterning material 330 and the ARC layer 328 are removed from the top surface of the second etch stop layer in preparation for performing operation 222. In FIG. 3D, the patterning material 330 and the ARC layer 328 are removed and the top surface of the etch stop layer (or, the first isolating portion 327) is uncovered. First isolating portion 327 is over the isolation structure 304.

Method 200 includes an operation 222, wherein conductive material 324 is etched and the top surface of the first etch stop layer 322 is exposed thereby. According to some embodiments, the conductive material is etched using a wet etch process or a liquid etch process. A selective liquid etch process is able to preserve the dimensions of the second etch stop layer while the conductive material is being etched because there is no physical bombardment of the second etch stop layer during the liquid etch process. The use of plasma etch to remove both the second etch stop layer and the conductive material results in rounding and/or erosion of the second etch stop layer during the removal of the conductive material (e.g., while exposing the first etch stop layer). Rounding and/or erosion of the second etch stop layer results in a very thin layer of second etch stop material at the edges of the conductive material. In some embodiments, the top surface of the conductive material is exposed, increasing the likelihood of short circuits to between the conductive material and a conductive via or conductive line above the top of the second etch stop layer.

In operation 222, a liquid etch process is used in order to preserve the width W1 of the first isolating portion formed by etching the second etch stop layer in operation 220. Further, in operation 222, a liquid etch process is used to create an amount of undercut of the first isolating portion formed by etching the second etch stop layer, such that the conductive material (the decoupling capacitor plate) has a smaller with than the width of the first isolating portion. An isotropic etch such as a liquid etch process allows for undercut of the first isolating portion without damaging the first isolating portion, leaving the edges of the first isolating portion to protect the edges of the conductive material (the decoupling capacitor plate) from short circuits during subsequent operations of a manufacturing process. In some embodiments, especially embodiments where the second etch stop layer is eroded during manufacture of the first isolating portion, the liquid etch process undercuts damaged parts of the first isolating portion, resulting in loss of part of the first isolating portion, and an edge angle A1 (θ) ranging from about 85° to about 90°.

The chemistry of the etching solution used to perform the liquid etch process is relevant to the preservation of the width of the first isolating portion formed during operation 220 and the width of the decoupling capacitor plate formed during operation 222 as the layer of conductive material is cleared to expose the first etch stop layer. The chemistry of the etching solution used to perform liquid etch process has high selectivity with regard to the etch stop layers above and below the conductive material. In other words, the etch rate of the conductive material is significantly higher than the etch rate of either of the first etch stop layer or the second etch stop layer. Thus, the width of the first isolating portion is preserved as the etching solution undercuts the edges of the first isolating portion to reduce the width of the decoupling capacitor plate. By preserving the dimensions of the second etch stop layer during the etch of the conductive material, the conductive material is better protected against accidental short circuits to conductive vias or conductive lines in other levels of the semiconductor device. In some embodiments, the conductive material is recessed underneath the second etch stop layer during a liquid etch process to expose the first etch stop layer, providing even greater protection against accidental short circuits. In some embodiments, the liquid etch solutions described hereinbelow have a selectivity of greater than 16 (e.g., the conductive material etches 16 times faster than the second etch stop material), preserving dimensions and shapes of the second etch stop layer during the conducive material etch.

Figure 3E:
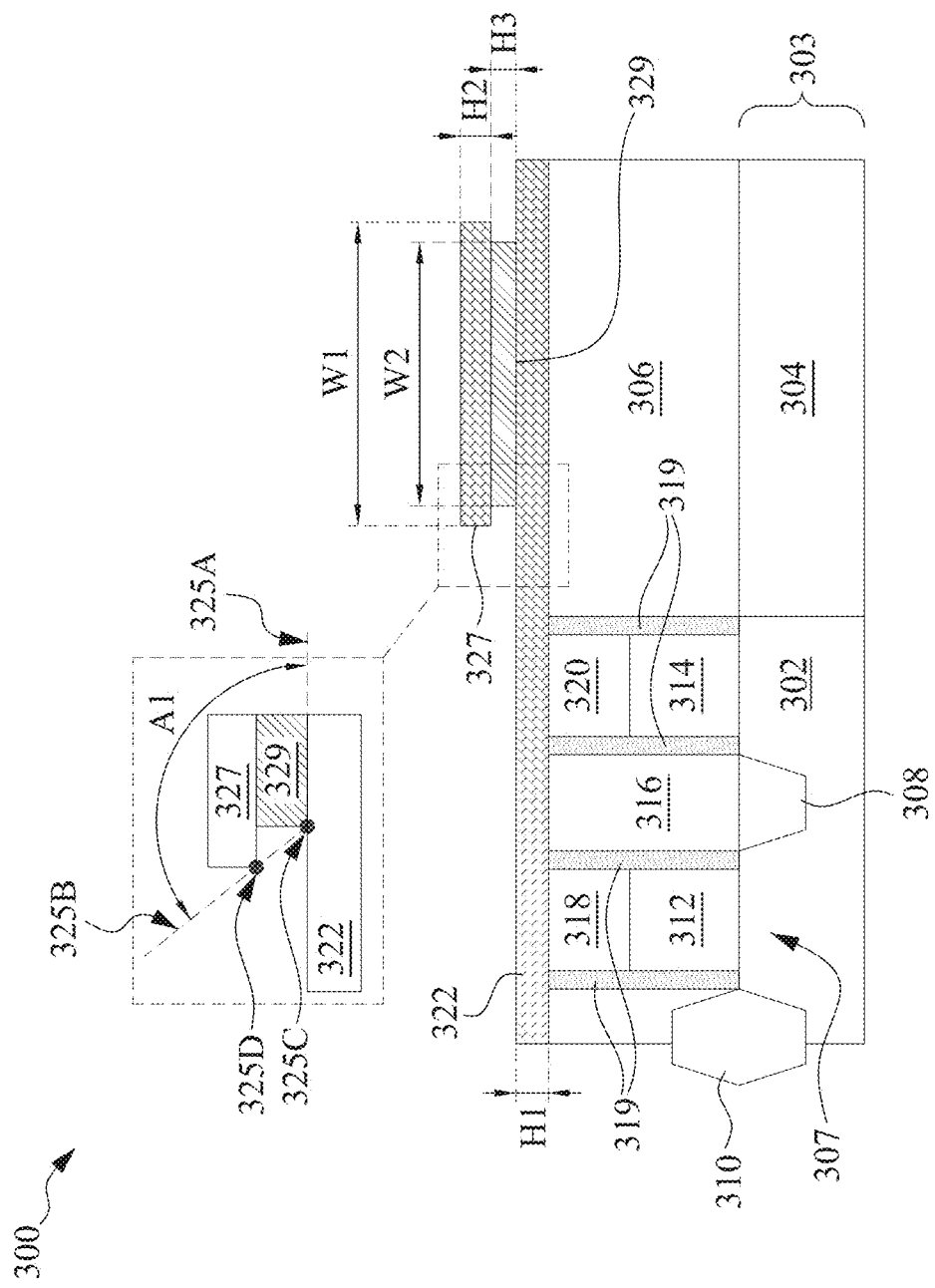

In FIG. 3E, the conductive material 324 has been etched by an etching solution to clear the conductive material from over the top surface of the first etch stop layer 322, exposing the first etch stop layer everywhere except where the first isolating portion 327 has masked the conductive material 324. The remaining portion of the conductive material 324 is a decoupling capacitor plate 329, with a width W2 which is smaller than the width W1 of the first isolating portion 327. In some embodiments, the first isolating portion 327 is an island feature formed during operation 220, and the decoupling capacitor plate 329 is a smaller island feature formed during operation 222, where first isolating portion is undercut on all sides, or along the entire perimeter of the first isolating portion, such that the area of the first isolating portion is larger than the area of the decoupling capacitor plate 329. The decoupling capacitor plate 329 is also located over the isolation structure 304, so as to reduce crowding in the interconnect structure directly over transistors of semiconductor device 300.

In FIG. 3E, a first reference line 325A extends along the interface between the top surface of the first etch stop layer 322 and the bottom surface of the decoupling capacitor plate 329. A second reference line 325B extends from a reference point 325C located at the edge of the interface between the top surface of the first etch stop layer 322 and the bottom surface of the decoupling capacitor plate 329, through a reference point 325D located at the bottom corner of the first isolating portion 327. An edge angle A1 (θ) is measured from the first reference line 325A at the interface between the first etch stop layer 322 and the decoupling capacitor plate 329, to the second reference line 325B.

In semiconductor devices formed by performing methods similar to method 200, the edge angle A1 is at least 85°. In some embodiments, the edge angle is greater than 90°. In some embodiments, the edge angle is greater than 95°. In some embodiments, the difference between the width W1 of the first isolating portion 327 and the width W2 of the decoupling capacitor plate 329 (e.g., W1−W2, a recess dimension) is at least 3 nm. A recess dimension of 0 nm is at some additional risk for short circuits because an edge of the conductive material is aligned with an edge of the second etch stop layer. A recess dimension of greater than 0 nm and about 3 nm provides some "overhang" of the second etch stop layer over the conductive material, greatly reducing the likelihood of short circuits occurring during manufacture of the semiconductor device. In some embodiments, the recess dimension is greater than about 3 nm, which is associated with loss of conductive material and reduction in the capacitance of the decoupling capacitor.

A further description of the etching solutions used to perform the operation 222 is provided below in the description of FIG. 4. In some embodiments, the etching solution includes hydrogen peroxide, which auto-dissociates in aqueous solution, to form H+ and HO2+ ions. In aqueous solution, both HO2+ and H2O2 react with TiN to form TiO2+. The titanium nitride etch rate is increased by making the etching solution more acidic such that H+ ions promote dissociation and reaction of $H2O_2$ with TiN.

In some embodiments, the etching solution MR1 (see below) is heated to a temperature of at least 25° C. and not more than 45° C. and applied to the exposed surface of the conductive material (see conductive material 324) for sufficient time to clear the exposed portion of the conductive material, revealing the first etch stop layer underneath the conductive material. In some embodiments, the etching solution MR2 (see below) is heated to a temperature of at least 25° C. and not more than 45° C. and applied to the exposed surface of the conductive material (see conductive material 324) for sufficient time to clear the exposed portion of the conductive material, revealing the first etch stop layer underneath the conductive material. Etch temperatures below about 25° C. etch the conductive material slowly, increasing the overall manufacturing time and manufacturing cost of the semiconductor device. Etch temperatures above 45° C. etch the conductive material in short times, which leads to increased etch non-uniformity across a wafer of semiconductor devices, making matching of semiconductor devices more difficult.

Method 200 includes an operation 224 wherein a second ILD material is deposited over the first etch stop layer, the decoupling capacitor plate, and the first isolating portion. Second ILD material deposition is typically by chemical vapor deposition (CVD) to produce a layer of solid or porous inter layer dielectric material to insulate the capacitor from conductive vias and conductive lines above the capacitor. In some embodiments, the second ILD material is a layer of silicon dioxide, carbon-doped silicon dioxide, porous dielectric material, or an organic insulating material deposited by, e.g., spin-on coating processes rather than CVD. In some embodiments, the second ILD material is a layer of dielectric material similar to the first ILD material deposited during operation 208. In some embodiments, the second ILD material is sufficiently thick to provide for reduced capacitance and/or reduced cross-talk between the decoupling capacitor plate formed during operation 222 and metal lines (or conductive lines) formed during subsequent manufacturing operations over the top surface of the second ILD material.

Figure 3F:
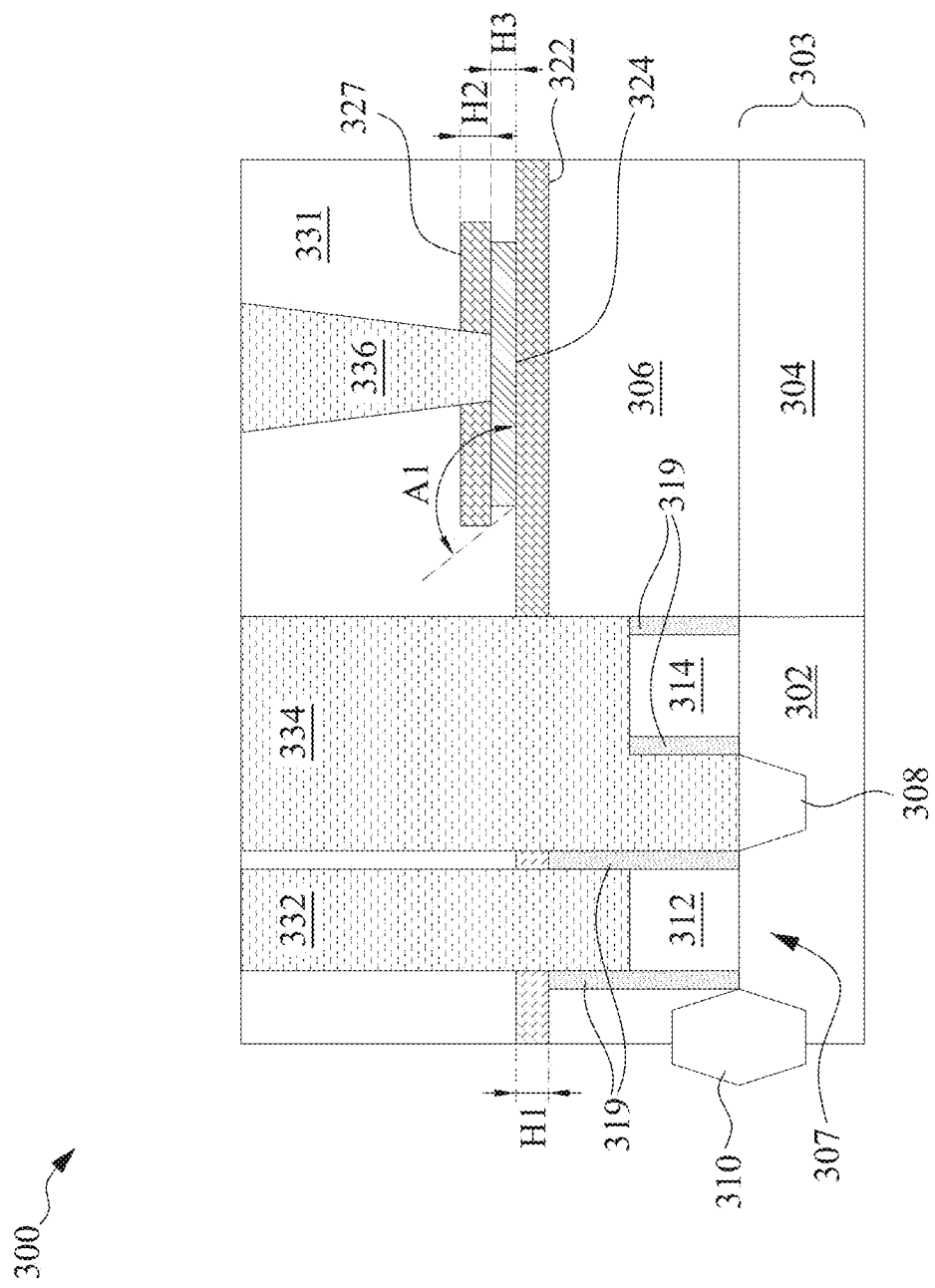

In FIG. 3F, the second ILD material 331 is deposited over the first isolating portion 327 and the decoupling capacitor plate 329, and contacts 332, 334, and 336 have been formed therethrough to make electrical contact with gate electrode 312 (contact 332), with gate electrode 314 (contact 334), and the decoupling capacitor plate 329 (contact 336). Contacts 332, 334, and 336 are formed through second ILD material 331 by a sequence of pattern transfer/second ILD etch, and metal fill steps as described hereafter. A layer of patterning material (e.g., photoresist or some other patterning material) is deposited over the top surface of the second ILD material, and a pattern transferred thereto. Pattern transfer includes photolithography, UV lithography, electron beam lithography, or other pattern transfer techniques used in semiconductor manufacturing. In some embodiments, pattern transfer includes removing an undeveloped or unexposed portion of the patterning material to leave a mask layer behind to protect a portion of the second ILD material. An exposed portion of the second ILD material is etched to expose features below the second ILD material. Once the underlying features have been exposed by the etch process, the layer of patterning material is removed and the conductive contact material of the contacts 332, 334, and 336 is deposited into the contacts to make electrical connections to the underlying features. In some embodiments, the conductive contact material is deposited by sputtering. In some embodiments, the conductive contact material is deposited by electroplating. In some embodiments, the conductive contact material is deposited by chemical vapor deposition (e.g., silicon deposited from a silane).

Decoupling capacitor plate 324 and first isolating portion 327 have an edge angle A1 of at least 85°, and width W2 of the decoupling capacitor plate 329 is smaller than width W1 of the first isolating portion 327.

Figure 4:
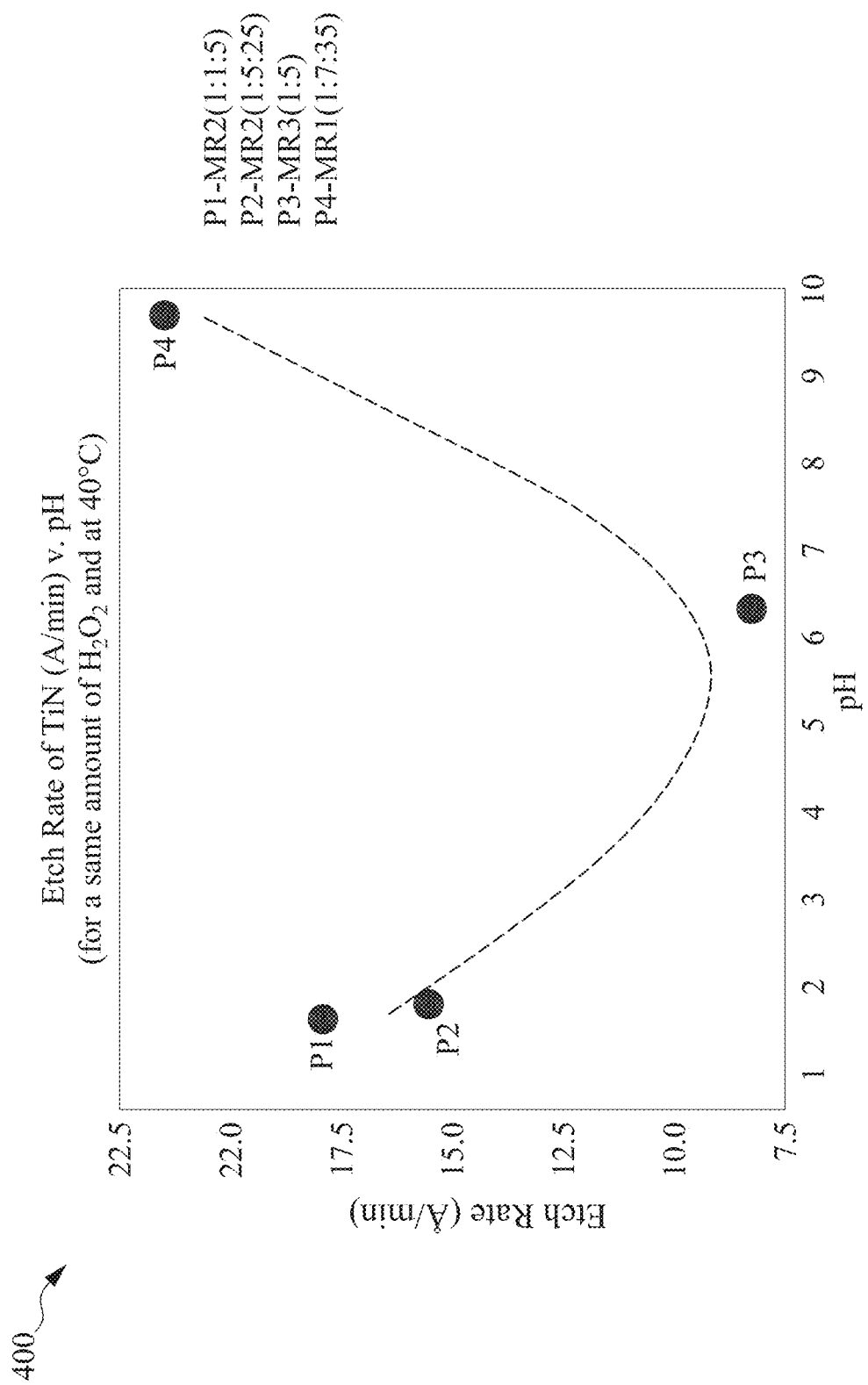
FIG. 4 is a graph of titanium nitride etch rates versus acidity, in accordance with some embodiments.

FIG. 4 is a graph 400 of titanium nitride etch rates versus acidity, in accordance with some embodiments. The points P1, P2, P3, and P4 on graph 400 represent the etch rates of etching solutions MR1, MR2, MR3, and MR4, respectively, for titanium nitride (TiN) in A/minute, with the etching solution at 40° C. with a same initial amount of hydrogen peroxide in the etching solution. The compositions of etching solutions MR1, MR2, MR3, and MR4 are provided in the table below:

| Etching Solution | Graph Point | Etch Rate (Å/min) | Blend of compounds in etching solution, by volume: |
|---|---|---|---|
| MR1(1:7:35) | P4 | ~22 | 1 part NH$_4$OH:7 parts H$_2$O$_2$:35 parts H$_2$O |
| MR2(1:1:5) | P1 | ~18 | 1 part HCl:1 parts H$_2$O$_2$:5 parts H$_2$O |
| MR2(1:5:25) | P2 | ~16 | 1 part HCl:5 parts H$_2$O$_2$:25 parts H$_2$O |
| MR3(1:5) | P3 | ~8 | 1 part H$_2$O$_2$:5 parts H$_2$O |

In water, hydrogen peroxide (H$_2$O$_2$) dissociates into H$^+$ and HO$_2^-$ as follows:

$$H_2O_2 \leftrightarrow H^+ + HO_2^- \quad \text{Equation (1)}$$

Titanium Nitride (TiN) reacts with H$_2$O$_2$ and HO$_2^-$ as follows:

$$TiN + 4H_2O + HO_2^- \rightarrow TiO^{2+} + 4OH^- + NH_4^+ \quad \text{Equation (2)}$$

$$TiN + 4H_2O_2 + 3H^+ \rightarrow TiO^{2+} + NO_x \quad \text{Equation (3)}$$

According to the data presented on graph 400, the etching solutions MR2(1:1:5) and MR2(1:5:25) have relatively high titanium nitride removal rates for low pH (e.g., pH<~3).

The etch rate of TiN by MR1(1:1:5) etching solution is proportional to the concentration of HO$_2^-$ ion in the etching solution [ER(MR1)~k$_1$[HO$_2^-$]]. The etch rate of TiN by MR2 etching solution is proportional to the product of the concentrations of hydrogen peroxide and hydrogen ion [ER(MR2)~k$_2$[H$_2$O$_2$][H$^+$]].

According to some embodiments, the pH of the etching solution applied to the semiconductor device to form the decoupling capacitor ranges from about 4 to about 1. Having a pH greater than about 4 results in a solution which has insufficient H$^+$ ion to promote the reaction between TiN and hydrogen peroxide.

In some embodiments, the temperature of the etching solution when applied to the semiconductor device is between about 25° C. and about 45° C. Etch temperatures below about 25° C. etch the conductive material slowly, increasing the overall manufacturing time and manufacturing cost of the semiconductor device. Etch temperatures above 45° C. etch the conductive material in short times, which leads to increased etch non-uniformity across a wafer of semiconductor devices, making matching of semiconductor devices more difficult.

In some embodiments, the temperature of the etching solution is between 30° C. and 35° C., inclusive. Etching the conductive material at between provides a balance between high etch rates with non-uniform removal, and slow etch rates with good removal, and increased manufacturing time and manufacturing cost.

In some embodiments, the concentration of hydrogen peroxide in the etching solution varies by ±15% from the quantities described above while still producing comparable etch rate and selectivity compatible with the performance of methods such as method 200, described above.

According to some embodiments, the concentration of H$_2$O$_2$ in etching solution varies up to about ±15% (e.g., 85% to 115%) from the proportions described above and still produces etch rate and selectivity results comparable to the results described on chart 500. Amounts of hydrogen peroxide in excess of +115% from the quantities described above add significant cost to the manufacturing process, without increasing the conductive material etch rate significantly. Amounts of hydrogen peroxide smaller than 85% of the quantities described above make the etch solution very dilute, reducing the etch rate and adding to the manufacturing time and cost of the semiconductor device. Further, deviations of hydrogen peroxide concentrations in excess of ±15% from the quantities described above results in loss of selectivity between the conducive material and the etch stop material, reducing the benefit of performing the liquid etch process to preserve the dimensions and edge shape of the second etch stop layer. Failing to preserve the dimensions and edge shape of the second etch stop layer results in increased likelihood of short circuits to the conductive material/capacitor plate in the semiconductor device.

Etching solution MR1 has a selectivity of greater than 16 (e.g., the conductive material (TiN) etches 16 times faster than the second etch stop material (TaN)), preserving dimensions and shapes of the second etch stop layer during the conducive material etch. Etching solution MR2 has an even greater selectivity of about 194 when etching TiN as the conductive material and TaN as the second etch stop material. Selectivity below about 16 results in rounding of the second etch stop layer, and loss of the second etch stop material, resulting in less protection of the conductive material/capacitor plate from accidental short circuits in subsequent manufacturing operations.

Figure 5:
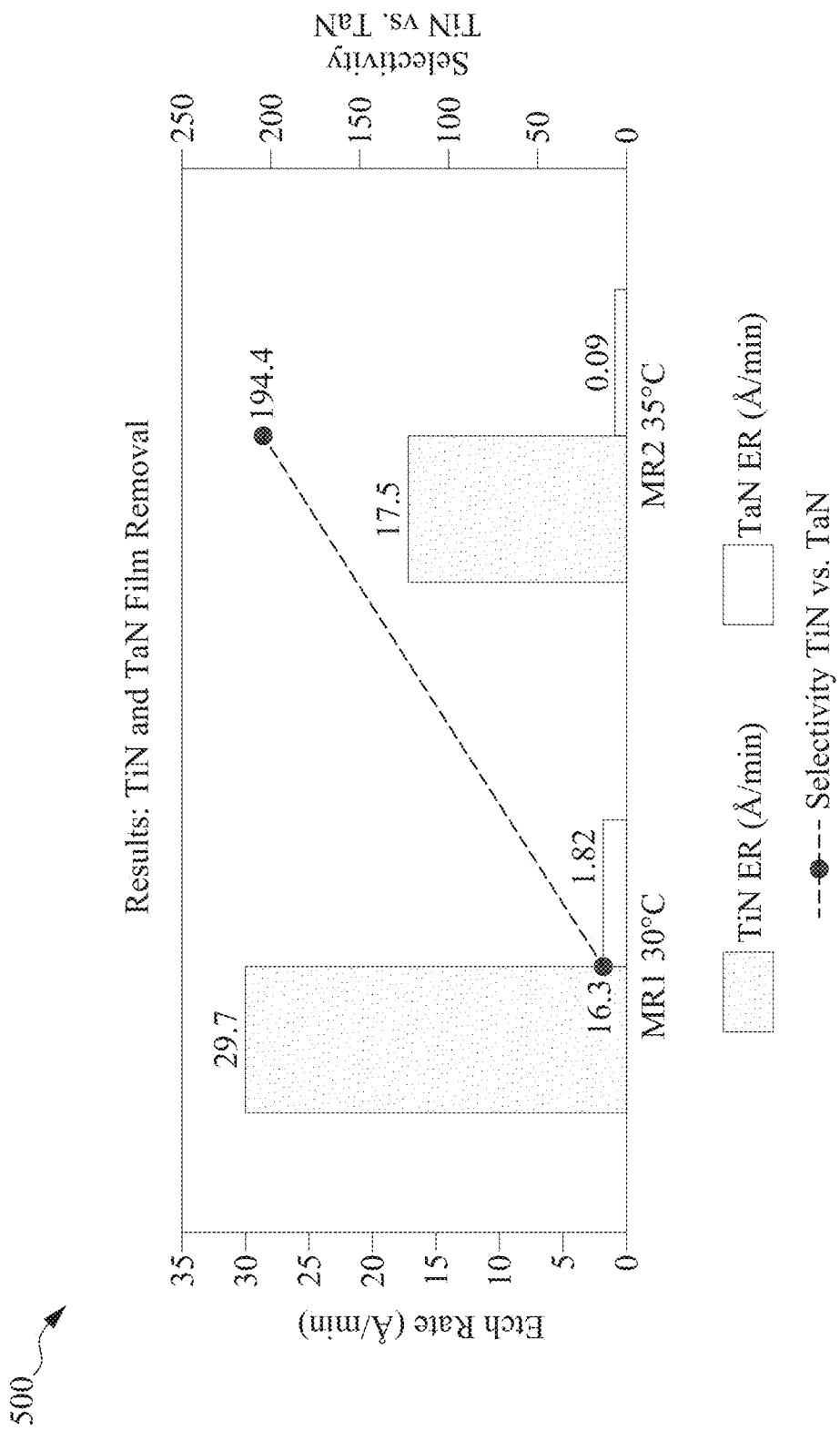
FIG. 5 is a graph of film removal results of semiconductor device manufacturing methods, in accordance with some embodiments.

FIG. 5 is a chart 500 of film removal results of semiconductor device manufacturing methods, in accordance with some embodiments. The etch rate of titanium nitride (ER (TiN)) and tantalum nitride (ER(TaN)) in MR1 etch solution at 30° C. are compared on the left side of chart 500. The etch rate of titanium nitride and tantalum nitride in MR2 etch solution at 35° C. are compared at the right side of chart 500. The dotted line with circular reference points indicates the difference in selectivity (between TiN and TaN, see the right axis of chart 500).

In MR1 etching solution at 30° C., TiN has an etch rate of 29.7 Å/min. and TaN has an etch rate of 1.82 Å/min., and the selectivity of TiN to TaN (e.g., ER(TiN)/ER(TaN)) is about 16.3. In MR2 etching solution at 35° C., TiN has an etch rate of 17.5 Å/min. and Tan has an etch rate of 0.09 Å/min., and the selectivity of TiN to TaN (e.g., ER(TiN)/ER(TaN)) is about 194.4.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method of making a semiconductor device. The method of making also includes forming source and drain structures of a transistor in a semiconductor substrate; forming a gate electrode of the transistor over the semiconductor substrate; forming an isolation structure in the semiconductor substrate, the isolation structure being adjacent to the transistor; depositing a first inter-dielectric layer (ILD) material over the transistor and the isolation structure; depositing a capacitor film stack over the first ILD material; etching a capacitor plate by etching a conductive material of the capacitor film stack, where etching the conductive material further may include performing a liquid etch process with a selectivity of at least 16 with regard to other materials in the capacitor film stack. Other embodiments of this aspect include corresponding computer systems, apparatus, and computer programs recorded on one or more computer storage devices, each configured to perform the actions of the methods.

Aspects of the present disclosure relate to method of making a semiconductor device, including operations of forming source and drain structures of a transistor in a semiconductor substrate; forming a gate electrode of the transistor over the semiconductor substrate; forming an isolation structure in the semiconductor substrate, the isolation structure being adjacent to the transistor; depositing an inter-layer dielectric (ILD) material over the transistor and the isolation structure; depositing a capacitor film stack over the ILD material; etching a first insulating material of the capacitor film stack using a dry etch process; and etching a conductive material of the capacitor film stack using a liquid etch process. In some embodiments, depositing the capacitor film stack over the ILD material further includes depositing a second etch stop layer over the ILD material, depositing the conductive material over the second etch stop layer, and depositing a first etch stop layer over the conductive material, wherein the first etch stop layer comprises the first insulating material. In some embodiments, the liquid etch process has a selectivity of at least 16. In some embodiments, the liquid etch process includes applying an etching solution containing hydrogen peroxide to the conductive material. In some embodiments, the liquid etch process includes recessing the conductive material layer beneath the first etch stop layer such that a width of the first etch stop layer is greater than a width of the conductive material layer. In some embodiments, the liquid etch process includes forming an edge angle of the conductive material layer below the first etch stop layer, with an edge of the second etch stop layer, of at least 85°. In some embodiments, the liquid etch process includes applying an etching solution to the conductive material, wherein an etch rate of the first etch stop layer in the etching solution is at least 150 times smaller than an etch rate of the conductive material layer in the etching solution. In some embodiments, the liquid etch process includes applying an etching solution having a pH of less than 3 to the conductive material. In some embodiments, depositing the second etch stop layer further includes depositing a layer of tantalum nitride (TaN), and depositing the conductive material further includes depositing a layer of titanium nitride.

Aspects of the present disclosure relate to a semiconductor device which includes a transistor in an active area of a substrate; an isolation structure in the substrate and adjacent to the active area; an inter-layer dielectric (ILD) over the isolation structure and the transistor; a first etch stop layer over a top surface of the ILD; a capacitor plate over the first etch stop layer; and an isolating portion over the capacitor plate, wherein the isolating portion has a first width, the capacitor plate has a second width, and the second width is smaller than the first width. In some embodiments, the capacitor plate further includes titanium nitride. In some embodiments, the isolating portion further includes tantalum nitride. In some embodiments, the first etch stop layer further includes tantalum nitride. In some embodiments, the first etch stop layer further includes a material other than tantalum nitride. In some embodiments, a difference between the first width and the second width is at least 3 nanometers. In some embodiments, the isolating portion has a thickness of at least 9 nanometers. In some embodiments, an angle extending from an edge of the capacitor plate to an edge of the isolating portion over the capacitor plate is at least 85°.

Aspects of the present disclosure relate to a semiconductor device, which includes forming an active area in a substrate; forming an isolation structure in the substrate; depositing a first inter-layer dielectric (ILD) material over the active area and the isolation structure; depositing a first etch stop layer over the first ILD material; depositing a capacitor plate material over the first ILD material; depositing an isolation material over the capacitor plate material; etching the isolation material to form an isolation plate over the capacitor plate material; etching the capacitor plate material to form a capacitor plate under the isolation plate by etching the capacitor plate material with a liquid etch process; and depositing a second ILD material over the capacitor plate and the isolation plate. In some embodiments, wherein forming the isolation plate further includes etching the isolation material using a plasma etch process and forming the capacitor plate under the isolation plate further includes applying an etching solution to the capacitor plate material to expose the first etch stop layer and recess the capacitor plate material under the isolation plate. In some embodiments, forming the capacitor plate under the isolation plate further includes etching the capacitor plate material with a selectivity of at least 16 with regard to an etch rate of the isolation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
 a semiconductor substrate;
 a first transistor comprising
  source and drain structures extending into the semiconductor substrate;
  a gate electrode over the semiconductor substrate;
 a dielectric isolation structure in the semiconductor substrate, the isolation structure being adjacent to the transistor;
 an inter-layer dielectric (ILD) material over the isolation structure;
 a first conductive material over the ILD material, wherein the first conductive material is electrically separated from the first transistor;
 a first insulating material over the first conductive material, the first insulating material extending beyond a periphery of the first conductive material; and
 a first etch stop layer between the ILD material and the first conductive material, wherein the first etch stop layer extends beyond a periphery of the first insulating material.

2. The semiconductor device according to claim 1, wherein:
 a lower edge of the first conductive material and a lower edge of the first insulating material define an angle of at least 95°.

3. The semiconductor device according to claim 1, wherein:
 the first insulating material extends beyond the periphery of the first conductive material by at least 3 nm.

4. The semiconductor device according to claim 1, wherein:
 the source and drain structures comprise an epitaxial semiconductor material.

5. The semiconductor device according to claim 4, wherein:
one of the source and drain structures extends above a plane defined by an upper surface of the semiconductor substrate.

6. The semiconductor device according to claim 1, further comprising:
first gate sidewalls adjacent the gate electrode.

7. The semiconductor device according to claim 1, further comprising:
a gate stack over the semiconductor substrate, wherein the gate stack is between the gate electrode and the dielectric isolation structure.

8. A semiconductor device, comprising:
a semiconductor substrate;
a transistor comprising
source and drain (S/D) structures extending into the semiconductor substrate;
a gate electrode over the semiconductor substrate;
an isolation structure in the semiconductor substrate, the isolation structure being adjacent to the transistor;
an inter-layer dielectric (ILD) material over the isolation structure and the transistor;
a first conductive material over the ILD material;
a first etch stop layer between the ILD material and the first conductive material; and
a first insulating material over the first conductive material, the first insulating material extending beyond a periphery of the first conductive material, wherein the first etch stop layer extends beyond a periphery of the first insulating material.

9. The semiconductor device of claim 8, wherein an angle between a first reference line extending from a bottom corner of the first conductive material to a bottom corner of the first insulating material and a second reference line parallel to a top surface of the ILD material is less than about 75-dgrees.

10. The semiconductor device of claim 8, wherein the first insulating material extends beyond the first conductive material by at least 3 nanometers (nm).

11. The semiconductor device of claim 8, further comprising a gate stack over the semiconductor substrate.

12. The semiconductor device of claim 11, further comprising a contact structure electrically connected to a first S/D structure of the S/D structures.

13. The semiconductor device of claim 12, wherein the contact structure is between the gate electrode and the gate stack.

14. The semiconductor device of claim 12, wherein the contact structure extends over the gate stack.

15. The semiconductor device of claim 8, wherein a thickness of the first conductive material ranges from 4 nm to 12 nm.

16. The semiconductor device of claim 8, wherein an entirety of the first conductive material is offset from the transistor in a direction parallel to a top surface of the semiconductor substrate.

17. A semiconductor device, comprising:
a semiconductor substrate;
a first transistor comprising:
source and drain structures extending into the semiconductor substrate;
a gate electrode over the semiconductor substrate;
a dielectric isolation structure in the semiconductor substrate, the isolation structure being adjacent to the transistor;
an inter-layer dielectric (ILD) material over the isolation structure;
a first conductive material over the ILD material;
a first insulating material over the first conductive material, the first insulating material extending beyond a periphery of the first conductive material; and
a first etch stop layer between the ILD material and the first conductive material,
wherein:
the first etch stop layer extends beyond a periphery of the first insulating material.

18. The semiconductor device of claim 17, wherein the first etch stop layer extends over the first transistor.

19. The semiconductor device of claim 17, further comprising:
a first contact electrically connected to the gate electrode;
a second contact electrically connected to the source structure or the drain structure; and
a third contact electrically connected to the first conductive material.

20. The semiconductor device of claim 19, wherein a top most surface of the first contact is coplanar with a top most surface of the second contact and a top most surface of the third contact.

\* \* \* \* \*